US005101764A

United States Patent [19]
Loewenstein et al.

[11] Patent Number: 5,101,764
[45] Date of Patent: Apr. 7, 1992

[54] METHOD AND APPARATUS FOR INTEGRATING OPTICAL SENSOR INTO PROCESSOR

[75] Inventors: Lee M. Loewenstein, Plano; Thomas E. Tang, Dallas; Ming Hwang, Richardson; Steve S. Huang, Rachelle Bienstock, both of Dallas, all of Tex.

[73] Assignee: Texas Instruments Incorporated, Dallas, Tex.

[21] Appl. No.: 658,121

[22] Filed: Feb. 20, 1991

[51] Int. Cl.⁵ ............................................. H01L 21/00
[52] U.S. Cl. .................................... 118/712; 118/715; 118/723; 427/10; 156/626; 156/345
[58] Field of Search ............... 156/626, 345; 427/10; 118/712, 715, 723

[56] References Cited

U.S. PATENT DOCUMENTS

| | | | |
|---|---|---|---|
| 4,141,780 | 2/1979 | Kleinknecht et al. | 427/10 |
| 4,654,226 | 3/1987 | Jackson et al. | 118/719 |
| 4,806,321 | 2/1989 | Nishizawa et al. | 118/725 |
| 4,960,071 | 10/1990 | Akahori et al. | 118/723 |
| 4,989,544 | 2/1991 | Yoshikawa et al. | 118/723 |

FOREIGN PATENT DOCUMENTS 0383491  8/1990  European Pat. Off.
62-090924  4/1987  Japan.
63-241919  10/1988  Japan.
01-139769  6/1989  Japan.
01-247573  10/1989  Japan.

OTHER PUBLICATIONS

"Controlling Deposition of Polymeric Coatings", by Gambino et al.; IBM; vol. 16, No. 9, 2-74, pp. 3065-3067.

Primary Examiner—David A. Simmons
Assistant Examiner—George Goudreau
Attorney, Agent, or Firm—James C. Kesterson; B. Peter Barndt; Richard L. Donaldson

[57] ABSTRACT

A method and apparatus for sensing radiation 26 indicative of at least one process variable in a semiconductor process chamber 10 in which a reactant gas reacts to effect changes in a silicon wafer 12. The method comprises positioning a substantially transparent window 22 in a conduit 14 leading to the wafer 12 and then flowing the reactant gas in the conduit 14 past the window 22 and toward the wafer 12. The radiation 26 is then sensed through the window 22. In the preferred embodiment the window 22 is positioned with an optical path along the center axis of the conduit 14. Other systems and methods are also disclosed.

20 Claims, 2 Drawing Sheets

METHOD AND APPARATUS FOR INTEGRATING OPTICAL SENSOR INTO PROCESSOR

NOTICE (C) Copyright, *M* Texas Instruments Incorporated 1990. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

FIELD OF THE INVENTION

This invention generally relates to the fabrication of semiconductor devices and specifically to a method and apparatus for integrating an optical sensor into a processor.

BACKGROUND OF THE INVENTION

In the field of semiconductor fabrication, it is often advantageous to perform inprocess measurements when fabricating a wafer. A sensor such as a interferometer, an optical emission sensor, a pyrometer, or an infrared monitor is used in the reaction chamber to provide feedback on various process parameters. The center of the wafer is often the optimum or preferred location for sensing changes caused by etch or deposition processes. In many processes, the reactant gases which effect the change in the semiconductor surface must be also aimed at the center of the wafer.

One problem, which exists with the measurement of processes using equipment such as advanced vacuum processors (AVP) as shown in FIG. 1 of U.S. Pat. No. 4,842,686, for example, is that changes in films at the center of the wafer may be obscured from the observation sensor by the necessary positioning of a tube for the passage of discharged gases in a centro symmetric fashion. In addition, certain monitoring processes, such as interferometry, are optimized when the sensor is positioned normal to the wafer surface.

Moreover, during deposition processes, when the window is placed off-center, for example upon the plate of the lower surface defining the reactor volume, deposition may occur on the window as a result of indiscriminate deposition throughout the reaction chamber. Unwanted deposition is also a problem in many important etch processes which include deposition of some components as part of their mechanism for obtaining selectivity.

The deposition of a material on the window is disadvantageous for observations based on optical emissions from the gas because the surface film may absorb a varying portion of the emitted radiation. It is also disadvantageous for interferometric measurement of surface film thicknesses, since the formation or alteration of a thin film on the window surface will contribute its own part to the total interference signal observed, and thus make the observed interference pattern difficult to interpret.

In past configurations, an additional gas, such as helium, has been purged past the sensor window to help prevent unwanted disposition. This solution is inadequate, however, because it does not account for the problem of the reactant gas tube obscuring the sensor or the desire to perform measurements at the center of the wafer.

Accordingly, improvements which overcome any or all of the problems are presently desirable.

SUMMARY OF THE INVENTION

Other objects and advantages will be obvious, and will in part appear hereinafter and will be accomplished by the present invention which provides a method and apparatus for sensing radiation indicative of at least one process variable where at least one reactant gas reacts to effect changes in a silicon wafer.

A method comprises positioning a window, which is transparent to the sensing radiation, in a conduit leading to the wafer in the chamber. A reactant gas is flowed in the conduit past the window and the radiation is sensed through the window. In one possible configuration, the window is positioned with an optical path along the center axis of the conduit and the reactant gas flows to the center of the wafer. The window is not coated by deposition from the reaction. Another reactant gas may be separately supplied to the chamber.

An apparatus comprises a chamber containing the wafer to be processed, a conduit for transferring the reactant gas to the wafer, and a window which is transparent to the radiation and positioned in the conduit. The window is not obscured by deposition from the reaction and remains transparent to the radiation. In one embodiment, the window may be positioned with an optical path along the center axis of the conduit. In addition, other reactant gases may be separately provided into the chamber. The window may be formed of a material inert to the reactant gas such as quartz or sapphire.

An advantage of the invention is that deposition of materials on the window will be eliminated in many instances since all of the necessary components for deposition will not be present. In addition, when the window is positioned with an optical path along the center axis of the conduit, direct observation of the center of the wafer is possible.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific way to make and use the invention, and do not delimit the scope of the invention.

The following is a description of the apparatus and method of the present invention. The preferred embodiment will be described first followed by a description of modifications. The method of using the invention will then be described.

Figure 1:
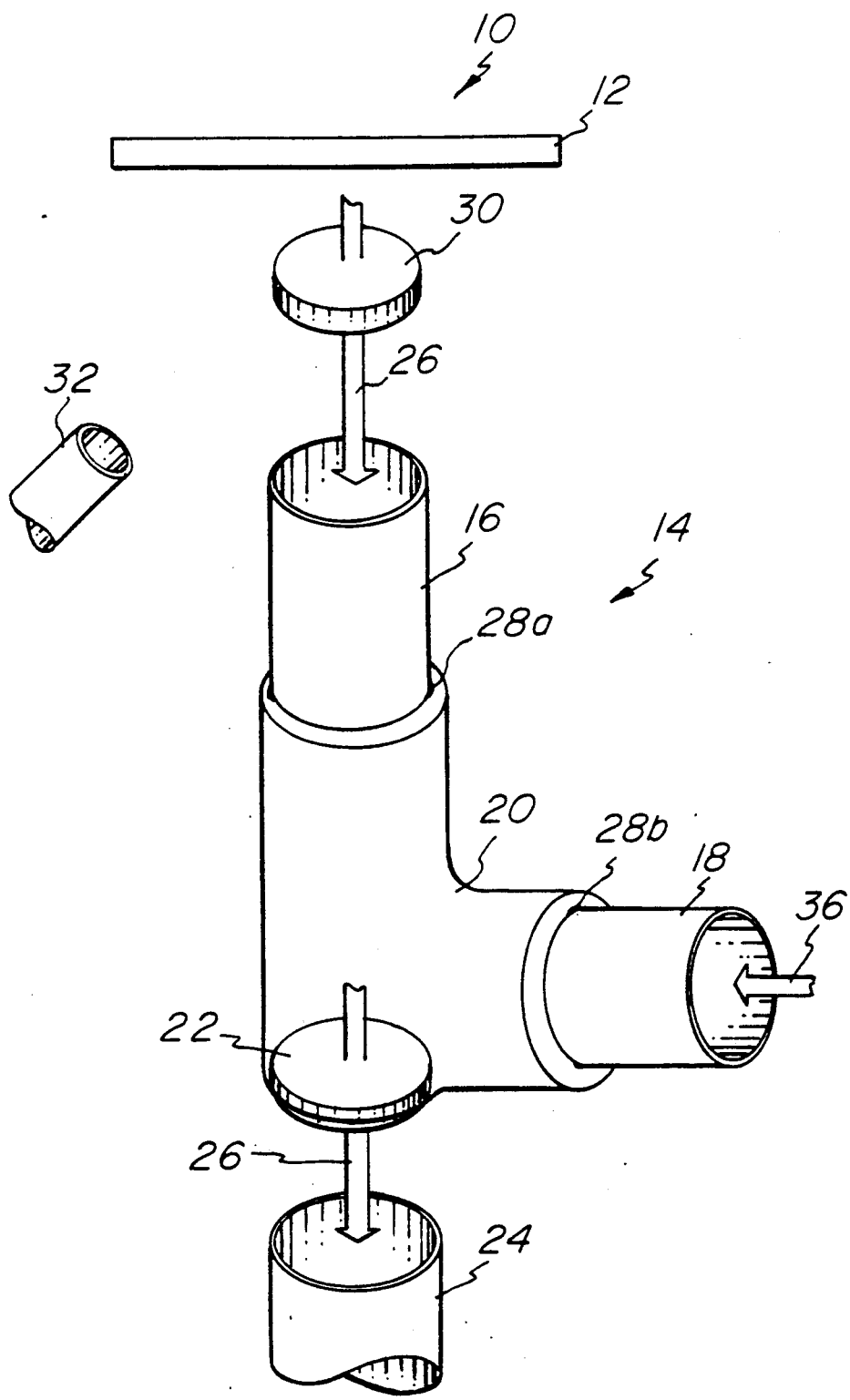
FIG. 1 is a diagram of the apparatus of the preferred embodiment of the present invention.

Referring first to FIG. 1, a portion of a processing chamber 10 is shown to illustrate the first embodiment of the present invention. A semiconductor wafer 12 is disposed in process chamber 10 for the purpose of fabrication. One such process chamber is an advanced vacuum chamber (AVP). The present invention applies to any of a number of fabrication processes including polysilicon deposition, oxide deposition, etching processes or photoresist ashing. One such process is disclosed in U.S. Pat. No. 4,842,686 issued June 27, 1989. The semiconductor wafer 12 may comprise silicon or other material such as gallium arsenide.

A reactant gas is flowed into the chamber 10 via a conduit 14. In prior art applications the conduit comprises a quartz tube. Specifically, the tube used for processors, such as AVPs, is a single piece of quartz with a 90 degree bend changing the flow of gases from horizontal after leaving the gas source 36, such as a microwave cavity, to vertical once the gases have entered the process chamber 10. In the present invention, the discharge/distribution tube 14 is redesigned by separation into two parts, vertical tube 16 and horizontal tube 18, joined by an appropriate 90 degree elbow 20. The diameters of vertical tube 16 and horizontal tube 18 are typically the same. A port for an optical window 22 is machined into the bottom surface of the elbow 20. A sensor 24 is positioned below the optical window 22 such that the optical path will be along the center axis of conduit 16. The sensor 24 will sense radiation 26 indicative of at least one process variable. As such, the optical window 22 must be transparent to radiation 26.

The union of the elbow 20 and the vertical tube 16 at 28a and the horizontal tubes 18 at 28b may be made of teflon, ceramic, or metal (such as stainless steel or anodized aluminum, for example). The material is chosen so as not to interfere with the energized species generated for the process at hand. The unions 28a and 28b may possibly be made of quartz, provided that the optical window 22 may be fused into the proper position normal to the optical axis defined by the quartz tube. O-ring or other means (for example, Swagelok or other similar means) may be used to connect the quartz tubes to the unions 28a and 28b. The window may be made of quartz, sapphire or other transparent material chosen for both transparency and inertness to process gases.

In the preferred embodiment, the vertical tube 16 and therefore the optical path of sensor 24 are positioned normal to the surface of wafer 12 and aimed at the center of the wafer 12.

In addition, a baffle 30 may be included between the reactant gas and the wafer 12. The baffle 30 must also be transparent to radiation 26. The baffle 30 functions to help distribute the reactant gases more uniformly. Also shown in FIG. 1 is a conduit 32 which is representative of conduits which may be provided to flow additional reactant gases into the process chamber 10.

Figure 2:
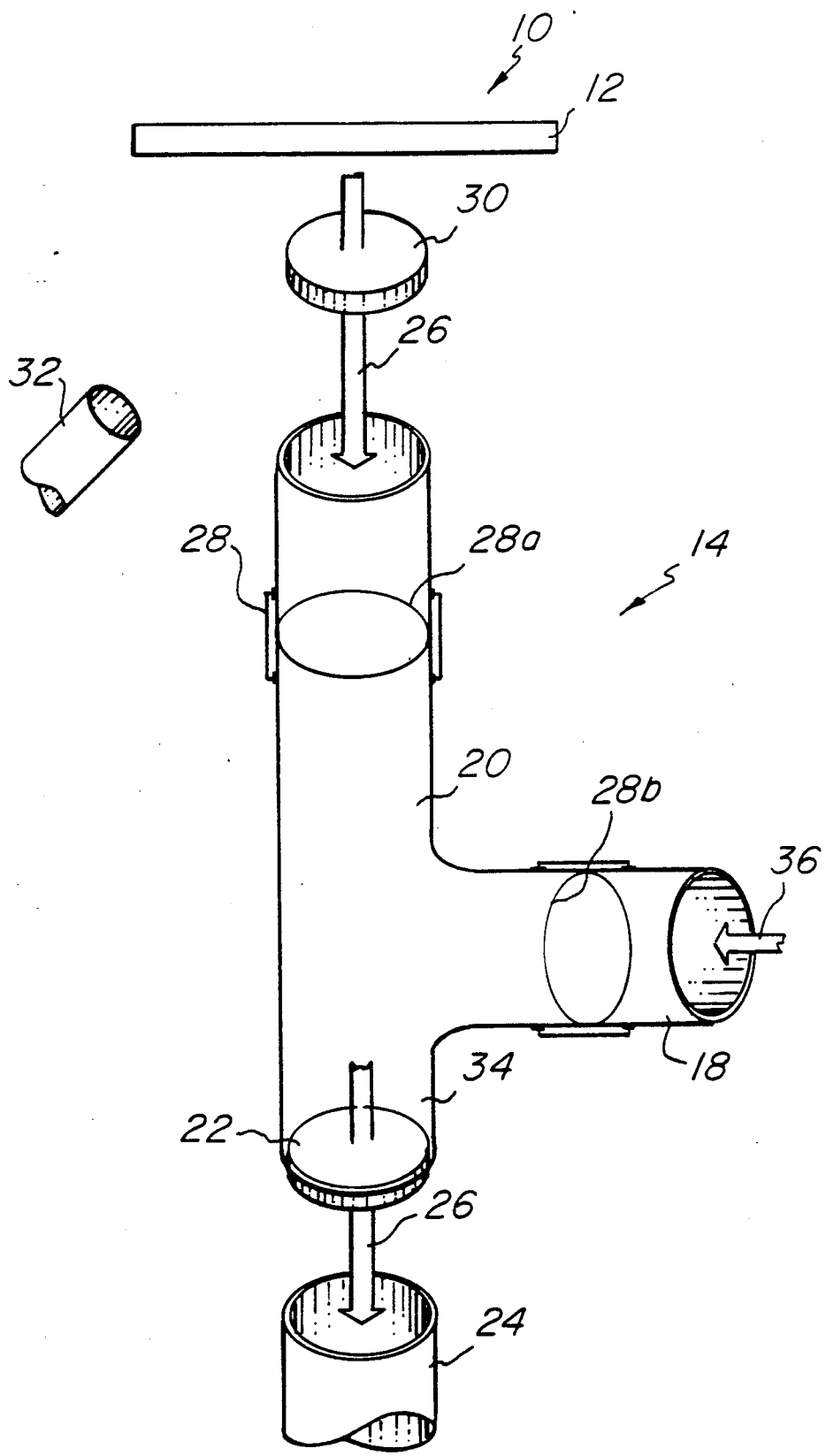
FIG. 2 is a diagram of an alternate embodiment of the present invention.

A modified version of the present invention is shown in FIG. 2. The reactant gas conduit 14 is substantially the same as shown in FIG. 1 with the exception the elbow joint 20 includes an extending portion 34. An advantage of this configuration is that the seal between optical window 22 and extension 34 may be kept at a temperature other than the temperature of the reactant gases.

Note also that an alternate method of forming unions 28a and 28b has been illustrated. The method of forming the union is strictly a choice of design and many alternatives which are well known in the current art are available. The methods shown in FIGS. 1 and 2 are strictly illustrative and are not intended to limit the scope of the present invention.

The present invention is utilized by flowing a reactant gas from source 36 towards wafer 12 via conduit 14. The reactant gases will flow past optical window 22. The gas is preferably non-reactive with the material used to form optical window 22. An example would be to flow oxygen past a quartz window 22 or fluorine past a sapphire window 22. In decomposition applications, a metastable inert gas species, such as helium, neon or argon, is used. Additional gases may also be flowed separately into the chamber.

The present invention may be used with many different fabrication processes. Examples are photoresist ashing, deposition of materials, such as silicon dioxide or polycrystalline silicon for example, etching of materials, or stripping of dielectric films. The present invention may also be used with in situ or RF plasmas which utilize a shower head configuration if the shower head is made of an optical grade material.

The process is monitored by using the vertical tube 16 as the optical axis for the sensor 24. For example, an interferometer, an optical emission sensor, a pyrometer, or an infrared monitor may be used. The sensor 24 sensors radiation indicative of a process variable. In some applications, such as interferometry, the sensor 24 may also supply the radiation and sense the reflected radiation. The sensor may be used to indicative variables such as temperature or coating thickness.

During processing, the wafer 12 may be stationery or rotating around the center point, as determined by the process being performed. In either case, the portion of wafer 12 being sensed not be moving, as long as the sensor 24 is aimed at the center of the wafer 12, and therefore will be constantly aligned with the optical path of sensor 24. This feature is beneficial for monitoring the wafer.

One advantage of the present invention is that deposition of material on the window 22 will be eliminated in many instances since all the necessary components for deposition are not available at the window. For example, when depositing silicon dioxide, oxygen ($O_2$) entered through conduit 14 and silane ($SiH_4$) separately entered through conduit 32 combine to deposit silicon dioxide on the surface of wafer 12. In this reaction, deposition will not occur until the silane has been in contact with the oxygen, which is not until the gases are past the observation window 22. Therefore, the problems associated with deposition on the window 22 are eliminated.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for sensing radiation indicative of at least one process variable in a semiconductor process chamber in which a reactant gas reacts to effect changes in a silicon wafer; said method comprising:

positioning a window substantially transparent to said radiation in a conduit leading to said wafer in said chamber;

flowing said reactant gas in said conduit past said window toward said wafer; and sensing said radiation indicative of said process variable through said window.

2. The method of claim 1, wherein said window is positioned with an optical path along the center axis of said conduit; whereby said reactant gas flows to the center of said wafer, and radiation can be sensed at the center of said wafer through said window, and said window remains substantially transparent to said radiation and is not coated by deposition from said reaction.

3. The method of claim 1, and further comprising the step of separately supplying at least one other reactant gas to said chamber via a path other than past said window.

4. The method of claim 1, wherein said window is formed of a material inert to said reactant gas.

5. The method of claim 4, wherein said window is formed of quartz and said reactant gas comprises oxygen.

6. The method of claim 1, and further comprising the step of supplying said radiation indicative of process variables through said window prior to sensing said radiation.

7. The method of claim 1, wherein said radiation is indicative of coating thickness.

8. The method of claim 1, wherein said radiation is indicative of temperature.

9. The method of claim 1, wherein said radiation comprises infrared radiation.

10. The method of claim 1, wherein said reaction forms silicon dioxide.

11. The method of claim 1, wherein said reaction forms polycrystalline silicon.

12. The method of claim 1, wherein said reaction comprises photoresist ashing.

13. The method of claim 1, wherein said reaction comprises stripping of dielectric films.

14. A method for sensing radiation indicative of at least one process variable in a semiconductor process chamber in which first and second reactant gases react to effect changes in a silicon wafer; said method comprising:

positioning a window, substantially transparent to said radiation and inert to said reactant bases, in a conduit with an optical path along the center axis of said conduit leading to said wafer in said chamber;

flowing said first reactant gas in said conduit past said window and toward the center of said wafer and separately supplying said second reactant gas to said chamber;

sensing said radiation indicative of process variables through said window, whereby said window is not obscured by said reaction and remains substantially transparent to said radiation and both the supply of the first reactant gas and the measuring of a process variable can be effected at the center of the wafer.

15. An apparatus for sensing radiation indicative of at least one process variable in a semiconductor process chamber in which a reactant gas reacts to effect changes in a silicon wafer, said apparatus comprising:

a chamber containing said wafer;

a conduit for transferring said reactant gas to said wafer in said chamber; and a window substantially transparent to said radiation and positioned in said conduit that leads to said wafer in said chamber, whereby said window is not obscured by deposition from the reaction and remains substantially transparent to said radiation.

16. The apparatus of claim 15 wherein said window is positioned with an optical path along the center axis of said conduit.

17. The apparatus of claim 15, and further comprising means for separately providing at least one other reactant gas to said chamber via a path other than past said window.

18. The apparatus of claim 15, wherein said window is formed of a material inert to said reactant gas.

19. The apparatus of claim 18, wherein said window is formed of quartz.

20. The apparatus of claim 18, wherein said window is formed of sapphire.

* * * * *